(12) United States Patent
Nishikawa et al.

(10) Patent No.: US 8,294,362 B2
(45) Date of Patent: Oct. 23, 2012

(54) IMAGE DISPLAY DEVICE, IMAGE DISPLAY SYSTEM, AND METHODS FOR FABRICATING THE SAME

(75) Inventors: Ryuji Nishikawa, Hsinchu (TW); Hsiang-Lun Hsu, Miaoli (TW)

(73) Assignee: Chimei Innolux Corporation, Chu-Nan (TW)

( * ) Notice: Subject to any disclaimer, the term of this patent is extended or adjusted under 35 U.S.C. 154(b) by 233 days.

(21) Appl. No.: 12/628,084

(22) Filed: Nov. 30, 2009

(65) Prior Publication Data

US 2010/0133998 A1 Jun. 3, 2010

(30) Foreign Application Priority Data

Dec. 1, 2008 (TW) ................................ 97146578 A

(51) Int. Cl.
*H05B 33/00* (2006.01)
(52) U.S. Cl. ............ 313/506; 313/113; 313/505; 445/25
(58) Field of Classification Search .................... None
See application file for complete search history.

(56) References Cited

U.S. PATENT DOCUMENTS

| 7,906,898 | B2* | 3/2011 | Lee | 313/504 |
| 2004/0012328 | A1* | 1/2004 | Arnold et al. | 313/504 |
| 2004/0113544 | A1* | 6/2004 | Murakami et al. | 313/504 |
| 2005/0029930 | A1* | 2/2005 | Yamazaki | 313/503 |
| 2008/0116791 | A1* | 5/2008 | Kim | 313/504 |
| 2008/0284326 | A1* | 11/2008 | Choi et al. | 313/504 |
| 2009/0127545 | A1* | 5/2009 | Park et al. | 257/40 |
| 2009/0206733 | A1* | 8/2009 | Hwang et al. | 313/504 |

FOREIGN PATENT DOCUMENTS

JP 2003-257662 9/2003

OTHER PUBLICATIONS

Okutani et al., "13.4: A 20.8-inch WXGA Full Color AMOLED Display by Integrating Scattering Reflector with Micro-Bumps", SID 07 Digest, pp. 173-176.

* cited by examiner

*Primary Examiner* — Ashok Patel
(74) *Attorney, Agent, or Firm* — Liu & Liu

(57) ABSTRACT

A display device including a display panel is provided, including a substrate having a luminance region and a none-luminance region thereover. An interlayer dielectric layer is disposed over the substrate. A reflection layer is disposed over the interlayer dielectric layer in the luminance region. A planarization layer is disposed over the reflection layer, having a rugged top surface corresponding to the reflection layer. A first electrode is disposed over the planarization layer, having a rugged top surface corresponding to the reflection layer. A pixel defining layer is disposed over the planarization layer, exposing the rugged top surface of the first electrode and defining the luminance region. An electroluminescent layer and a second electrode are sequentially stacked over the first electrode.

15 Claims, 5 Drawing Sheets

IMAGE DISPLAY DEVICE, IMAGE DISPLAY SYSTEM, AND METHODS FOR FABRICATING THE SAME

CROSS REFERENCE TO RELATED APPLICATIONS

This Application claims priority of Taiwan Patent Application No. 97146578, filed on Dec. 1, 2008, the entirety of which is incorporated by reference herein.

BACKGROUND OF THE INVENTION

1. Field of the Invention

The present invention relates to manufacturing techniques of display devices, and in particular to active-matrix type array substrates for electroluminescence display devices.

2. Description of the Related Art

New generation of flat panel devices, such as organic light emitting display (OLED) devices of electroluminescent displays have advantages of self-luminescence, a thin profile, being light weight, and having high luminance efficiency. In accordance with driving methods, an OLED device can be classified as an active matrix type or a passive matrix type OLED device.

Nevertheless, to enhance image resolution of the OLED devices, luminance of display pixels in the OLED device can be further improved.

In FIG. 1, a conventional electroluminescent (EL) device disclosed in Japanese laid-open patent application No. 2003-257662 is illustrated. The EL device includes components such as an insulating substrate 10, a gate electrode 11, a gate insulating layer 12, an active layer 13 (including a channel region 13c, a drain region 13d and a source region 13s), a stop layer 14, an interlayer insulating layer 15, a drain electrode 16, a planar insulating layer 17, an anode 22, a hole transport layer 23, a light emitting layer 24, an electron transport layer 25, and a cathode 26.

Since the planar insulating layer 17 is formed with a rugged top surface, the anode 22, the hole transport layer 23, the light emitting layer 24, the electron transport layer 25, and the cathode 26 are conformably formed over the planar insulating layer 17. Thus, the above-mentioned layers formed over the planar insulating layer 17 also have rugged top surfaces. Thus, the light emitting area $S_1$ of a light emitting element formed of the anode 22, the hole transport layer 23, the light emitting layer 24, the electron transport layer 25, and the cathode 26 all have increased rugged top surfaces, improving luminance.

Nevertheless, the anode 22 illustrated in FIG. 1 functions as a reflection layer, and the hole transport layer 23 encapsulating the anode 22 may cause negative battery effects and corrosion at edges of the anode 22. In addition, since the planar insulating layer 17 is formed with the rugged top surface, film delamination may occur between the anode 22 and the planar insulating layer 17 formed thereon. The above two undesired phenomena decrease reliability of the light emitting element.

In FIG. 2, a conventional OLED device according to a reference entitled "A 20.8-inch WXGA Full Color AMOLED Display by integrating Scattering Reflector with Micro-Bumps" of SID 07 DIGGEST, p 173-176, is illustrated.

As shown in FIG. 2, the OLED device includes a cap glass 66, a substrate 50 and sealant 68 for substantially defining a space for disposing a display pixel. The display pixel is substantially formed of elements such as a thin film transistor 52, micro-bumps 54, a reflection layer 56, a planar layer 58, an anode 60, an emission layer 62 and a cathode 64 wherein the anode 60, emission layer 62 and cathode 64 form a light emitting element and thus emits light 70 during operation thereof. Scattered light 72 is also provided from the reflection layer 56 and light extraction efficiency of the display pixel can thus be improved.

However, since the reflection layer 56 is formed with a rugged top surface, an additional process is needed to form the planar layer 58 on the reflection layer 56 for the convenience of sequentially formed elements fabrication. In addition, since the layers for forming the light emitting element are planarization films, a light emitting region therein is relative small, thus hindering light extraction efficiency and light luminance thereof.

BRIEF SUMMARY OF THE INVENTION

Thus, an improved image display system is provided.

An exemplary image display device including a display panel is provided, comprising a substrate having a luminance region and a none-luminance region thereover. An interlayer dielectric layer is disposed over the substrate. A reflection layer is disposed over the interlayer dielectric layer in the luminance region. A planarization layer is disposed over the reflection layer, having a rugged top surface corresponding to the reflection layer. A first electrode is disposed over the planarization layer, having a rugged top surface corresponding to the reflection layer. A pixel defining layer is disposed over the planarization layer, exposing the rugged top surface of the first electrode and defining the luminance region. An electroluminescent layer and a second electrode are sequentially stacked over the first electrode.

An exemplary method for forming an image display device is provided, comprising forming an interlayer dielectric layer over a substrate, wherein the substrate has a luminance region and a non-luminance region thereover. A reflection layer is formed over the interlayer dielectric layer in the luminance region. A planarization layer is formed over the reflection layer, having a rugged top surface corresponding to the reflection layer. A first electrode is formed over the planarization layer, having a rugged top surface corresponding to the reflection layer. A pixel defining layer is disposed over the planarization layer, exposing the rugged top surface of the first electrode and defining the luminance region. An electroluminescent layer and a second electrode are sequentially stacked over the first electrode.

An exemplary image display system comprising an image display device as described above and an input unit coupled to the image display device to control the image display device for rendering an image is provided.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 3a~3f are schematic cross section views showing fabrication of an image display device according to an embodiment of the present invention.

In the image display device of the invention, light out coupling efficiency and light extraction efficiency of the light emitting element are improved by forming a light emitting device therein with rugged film surfaces and disposing a reflection layer under the light emitting element. In addition, negative battery effects and corrosion at edges of the anode and the reflection layer of the light emitting element of the invention are reduced or diminished. Thus, improving image resolution and lifetime of an image display system using this image display device of the invention.

Referring to FIGS. 3a~3f, an embodiment for fabricating a display panel 100 of an image display device, such as an electroluminescent display device, is illustrated.

Figure 3A:
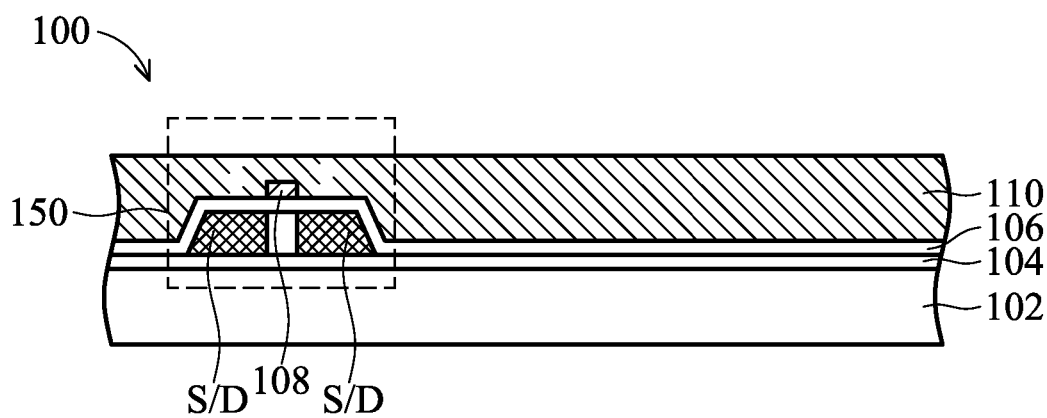
FIGS. 3a~3f are schematic cross section views showing fabrication of an image display device according to an embodiment of the present invention.

Referring to FIG. 3a, the display panel 100 having a substrate 102 is illustrated. The substrate 102 is formed with a buffer layer 104 thereon, and a thin film transistor (TFT) 150 is formed over the buffer layer 104. The TFT 150 comprises a gate dielectric layer 106, a pair of source/drain regions S/D, a channel region disposed between the source/drain regions S/D, and a gate electrode 108 formed over the gate dielectric layer 106. Herein, the gate dielectric layer 106 is disposed over the entire surface of the substrate 102 and covers the buffer layer 104. Next, an interlayer dielectric layer 110 is disposed over the TFT 150 and the buffer layer 104 to form a substantially planar top surface over the substrate 102 including the TFT 150, which is for the convenience of sequential fabrication processes.

According to various embodiments, the substrate 102 comprises a transparent insulating material such as glass, plastic, or ceramic substrate. The TFT 150 can be, for example, an amorphous-silicon thin film transistor (a-Si:H TFT), a low temperature poly-silicon thin film transistor (LTPS-TFT), or an organic thin film transistor (OTFT). The interlayer dielectric layer 110 may comprise insulating material such as oxides, nitrides, carbides or combinations thereof.

Figure 3B:
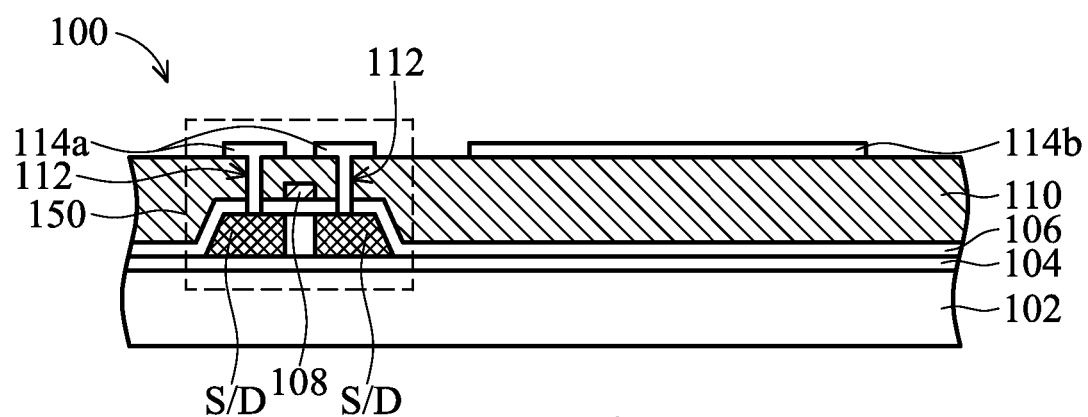

In FIG. 3b, a photolithography process and an etching process (both not shown) are sequentially performed, thereby forming two openings 112 penetrating the interlayer dielectric layer 110. The openings 112 respectively expose a portion of the source/drain regions S/D of the TFT 150. Next, a layer of conductive material is blanketly formed over the interlayer dielectric layer 110 and fills each of the openings 112. Next, a photolithography process and an etching process (both not shown) are performed to pattern the layer of the conductive material and forms a plurality of patterned conductive layer 114a and 114b over the interlayer dielectric layer 110. At this time, the conductive layer 114a substantially aligns to the source/drain regions S/D and fills in the openings 112, thus coupling to the source/drain region S/D. The conductive layer 114b is formed over a part of the substrate adjacent to the conductive layer 114a and functions as a reflection layer (also named as reflection layer 114b in the following). The reflection layer 114b does not cover the TFT 150 and has a planar top surface. The reflection layer 114b is electrically insulated from the conductive layer 114a. The reflection layer 114b may comprise opaque conductive materials having high reflection of 80% or above, such as Al, Ag, Mg, Pd, Pt or an alloy thereof comprising one or more other elements.

Figure 3C:
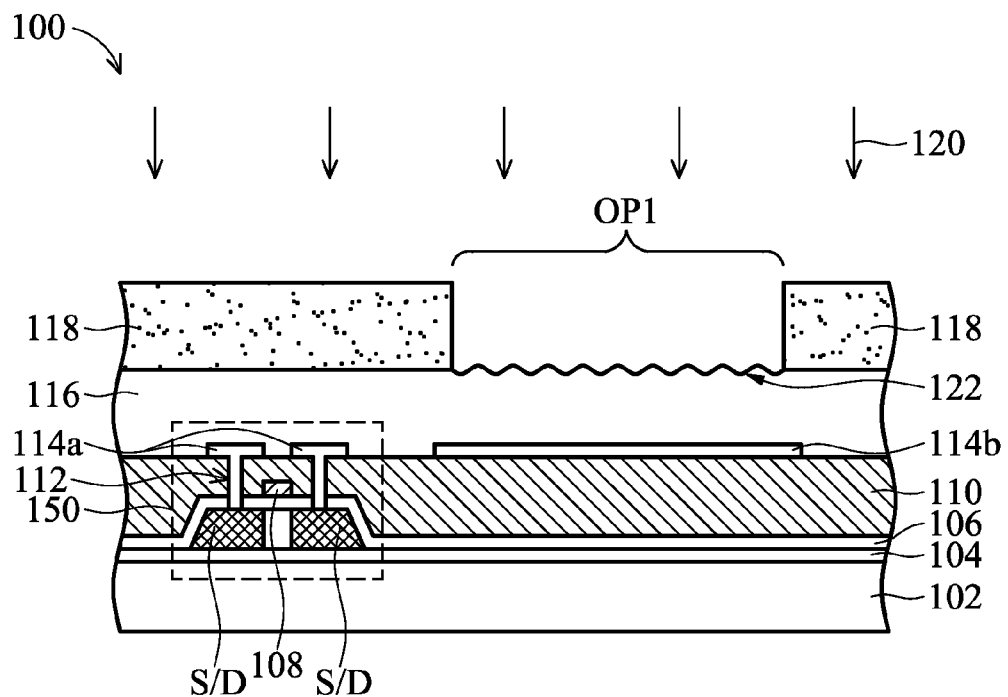

Referring to FIG. 3c, a planarization layer 116 is formed over the conductive layer 114a and 114b. The planarization layer 116 can be dielectric materials such as spin on glass (SOG) or the like. Next, a resist layer 118 is formed over the planarization layer 116 and an opening OP1 are formed in the resist layer 118 by a photolithography process (not shown). The opening OP1 substantially aligns to the reflection layer 114b and is disposed over a part of the planarization layer 116 above the reflection layer 114b. Next, a surface treating process 120 is performed to treat the proton of the top surface of the planarization layer 116 exposed by the resist layer 118, using the resist layer 118 as a mask, thereby forming a rugged top surface 122. The surface treating process 120 can be, for example, a plasma etching process or a plasma etching process incorporating a suitable shielding mask.

Figure 3D:
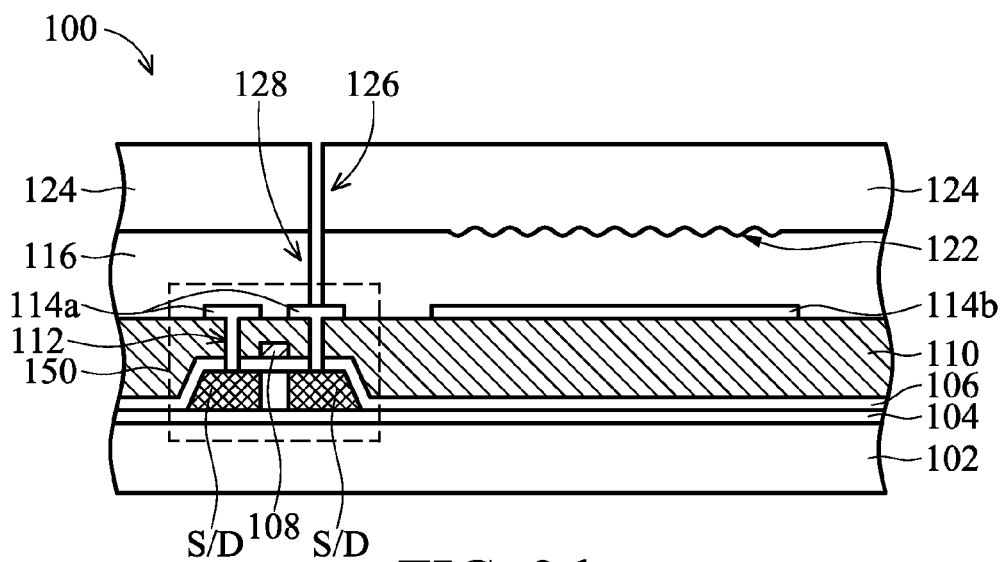

Referring to FIG. 3d, after removal of the resist layer 118, another resist layer 124 is formed over the planarization layer 116. A photolithography process (not shown) is then performed to form an opening 126 in the resist layer 124. The opening 126 is formed through the resist layer 124 and is substantially aligned to one of the source/drain regions S/D of the TFT 150. Next, an etching process such as a dry etching process is performed, using the resist layer 124 as an etching mask, to remove the interlayer dielectric layer 116 exposed by the opening 126, thus exposing a portion of the conductive layer 114a and forming a contact opening 128 in the planarization layer 116. The contact opening 128 is formed through the planarization layer 116.

Figure 3E:
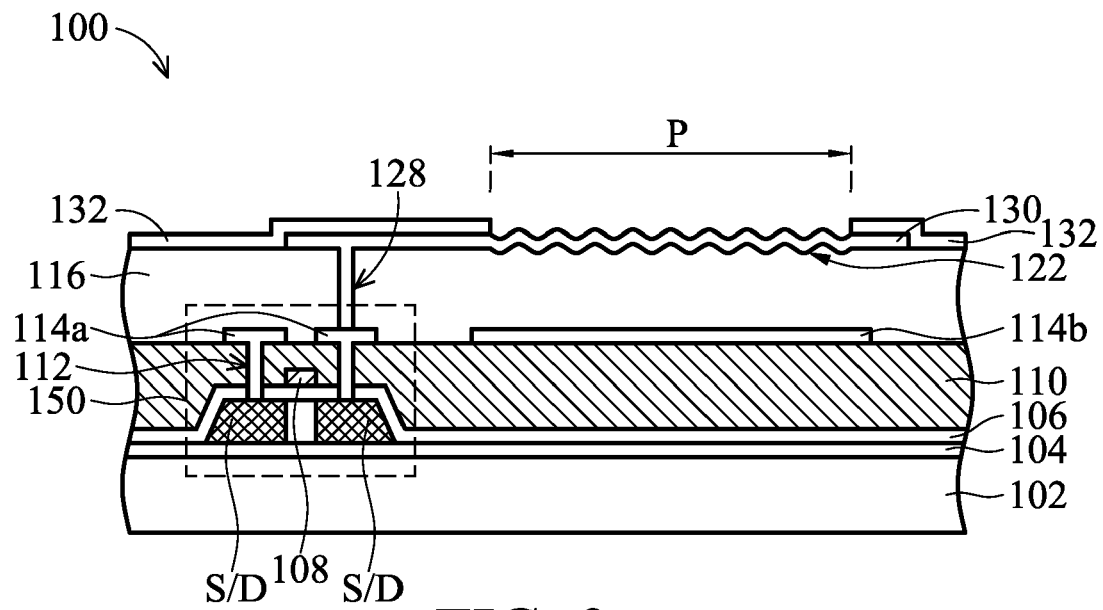

Referring to FIG. 3e, after removal of the resist layer 124, a layer of conductive material is formed over the planarization layer 116. The conductive layer is conformably formed over the planarization layer 116 and fills the contact opening 128, thereby physically contacting with the conductive layer 114a exposed by the contact opening 128. Next, a photolithography process and an etching process (both not shown) are performed to pattern the layer of conductive material, thereby leaving a portion of the conductive material over the planarization layer 116 as an anode 130 of a light emitting element. Since the anode 130 substantially covers the rugged surface 122 of the planarization layer 116, the anode 130 also has a substantially rugged top surface corresponding to the rugged surface 122 of the planarization layer 116. In addition, the anode 130 also fills the contact opening 128 and couples to the source/drain region S/D of the TFT 150. Material of the anode 130 can be metal such as Al, Ag, Mg, Pd, Pt and their alloy or transparent metal oxides, such as, indium tin oxide (ITO), indium zinc oxide (IZO), aluminum zinc oxide (AZO), or zinc oxide (ZnO) either individually or in combinations thereof. While the anode 130 comprises metal, it is formed with a thickness of about 5-200 Å and has a transparency of more than 50%. The anode 130 can be formed by methods such as sputtering, electron beam evaporation, thermal evaporation, chemical vapor deposition or spray pyrolysis.

Next, a pixel defining layer 132 is conformably formed over the anode 130, comprising materials such as silicon oxide, silicon nitride, silicon oxynitride, organic non-conductive polymers or combinations thereof. The pixel defining layer 132 can be formed by methods such as physical vapor deposition, chemical vapor deposition or a spin on method. Next, a photolithography process and an etching process (both not shown) are performed by incorporating a suitable resist mask (not shown) to pattern the pixel defining layer 132 and expose the rugged top surface of the anode 130, thereby defining a luminance region P. The region other than the luminance region P is defined as a non-luminance region. That is, as shown in FIG. 3e, the reflection layer 114b is merely formed in the luminance region P and the TFT 150, and the conductive layer 114a is disposed in the non-luminance region. The reflection layer 114b and the conductive layer 114a are insulated from each other by the planarization layer 116.

Figure 3F:
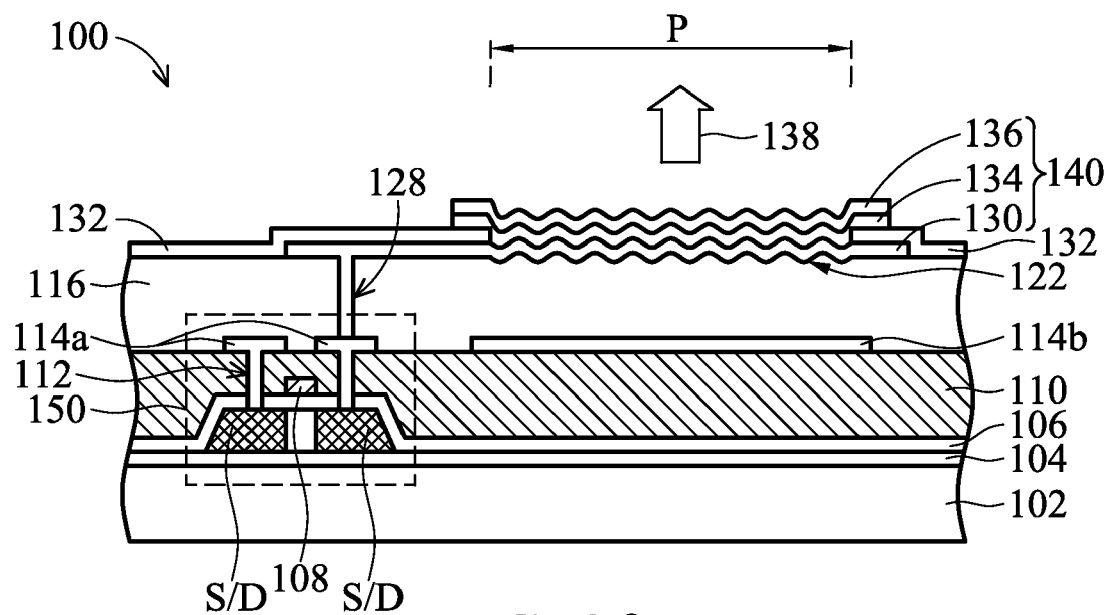

Referring to FIG. 3f, a layer of electroluminescent material and a layer of conductive material are sequentially formed over the pixel defining layer 132 and the anode 130. A photolithography process and an etching process (both not shown) are then performed and thus forms a stacked electroluminescent layer 134 and a cathode 136 over the anode 130 and portions of the pixel defining layer 132 adjacent thereto. The anode 130 and the electroluminescent layer 134 and the cathode 136 stacked thereover form a light emitting element 140, wherein the electroluminescent layer 134 and the cathode 136 both have a rugged top surface corresponding to the reflection layer 114b. The number 138 is a light-out direction of the light emitting element 140, illustrated as a direction away from the substrate 102.

The electroluminescent layer 134 may comprise materials such as organic materials or inorganic materials, such as a small molecule material, polymer, or organic-metallic complex. The electroluminescent layer 134 can be formed by methods such as thermal vacuum evaporation, spin coating, injection-filling, or screen-printing. The cathode 136 may comprise metal such as Al, Ag, Mg, Pd, Pt and their alloy or transparent metal oxides, such as, indium tin oxide (ITO), indium zinc oxide (IZO), aluminum zinc oxide (AZO), or zinc oxide (ZnO) either individually or in combinations thereof. The cathode 136 can be formed by methods such as sputtering or thermal evaporation.

Referring to FIG. 3f, since the anode 130, the electroluminescent layer 134 and the cathode 136 of the light emitting element 140 are all formed with a rugged top surface, and the reflection layer 114b having a planar top surface is provided under the light emitting element 140, light coupling efficiency, light extracting efficiency, luminance and viewing angle of the light emitting element 140 are improved.

Figure 1:
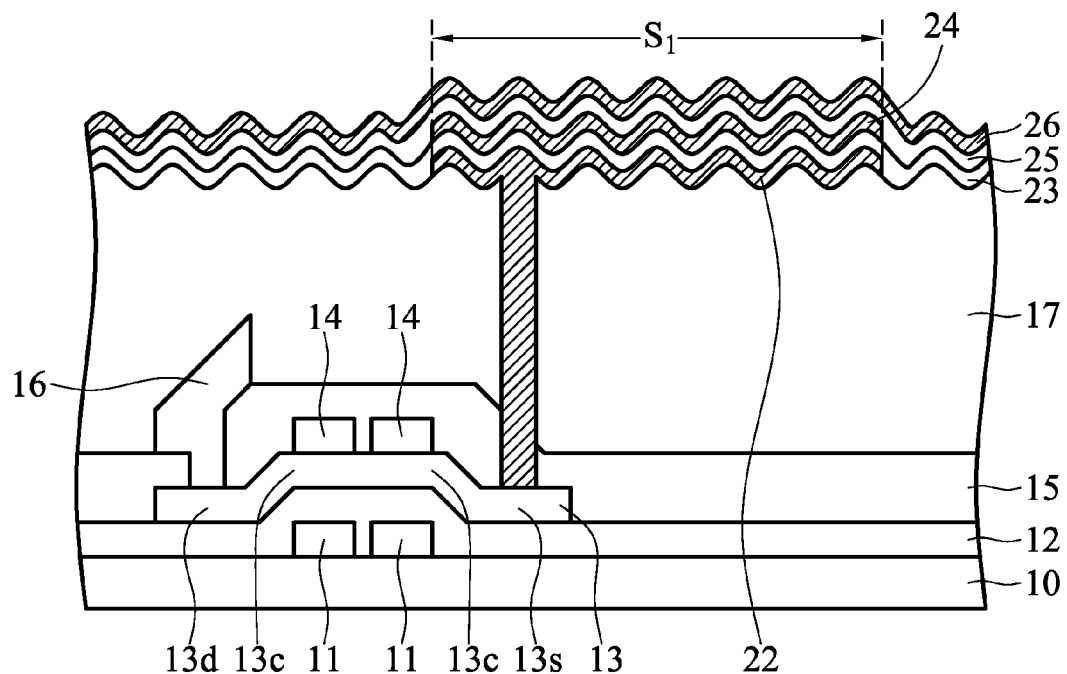
FIG. 1 is cross section of a conventional electroluminescent (EL) display device.

In addition, since the light emitting layer 134 is partially disposed over the pixel defining layer 132 but does not cover or connect with an edge of the underlying anode 130, negative battery effects and electrode corrosion found in the EL display device illustrated in FIG. 1 is prevented for the light emitting element 140, thereby improving reliability of the OLED device as illustrated in FIG. 3f.

Moreover, since the reflection layer 114b is embedded between the planarization layer 116 and the interlayer dielectric layer 110, the negative layer delamination issue found in the EL display device illustrated in FIG. 1 is prevented for the OLED device illustrated in FIG. 3f.

Figure 2:
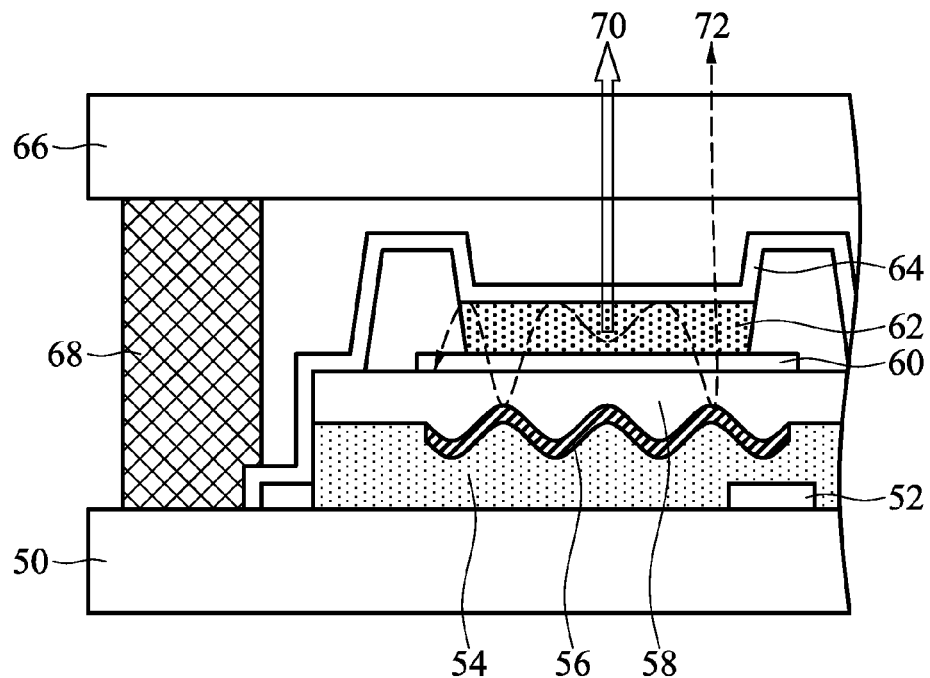
FIG. 2 is cross section of a conventional organic light emitting display (OLED) device.

In addition, the reflection layer 114b and the conductive layer 114a for coupling with the source/drain region S/D are simultaneously formed and are both covered by the planarization layer 116. Thus, processes for respectively forming the reflection layer and the planar layer in the OLED display device illustrated in FIG. 2 can be reduced, and a simplified fabrication process for forming an array substrate is thus obtained.

Figure 4:
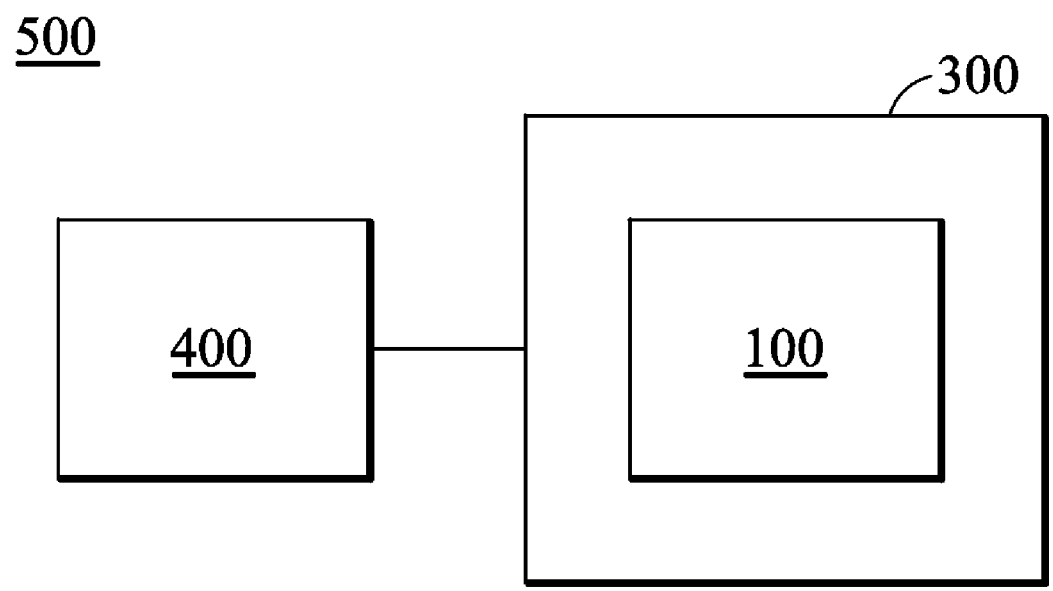
FIG. 4 is a schematic view showing an image display system according to an embodiment of the present invention.

FIG. 4 shows an image display system 500 comprising components such as an image display device 300 and an input unit 400. The image display device 300 incorporates the display panel 100 as shown in FIG. 3f and is capable of applications in multiple electronic devices (e.g. the image display system 500). An input unit 400 is coupled to the image display device 300 to input suitable signals such as image signals to the image display device 300 to render an image. The image display system 500 may be a portable device such as a PDA, notebook computer, tablet computer, cellular phone, or a display monitor device, or a non-portable device such as a desktop computer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image display device including a display panel, comprising:
   a substrate having a luminance region and a none-luminance region thereover;
   an interlayer dielectric layer disposed over the substrate;
   a reflection layer disposed over the interlayer dielectric layer in the luminance region, wherein the reflection layer does not extend to electrically connect to any other structure;
   a planarization layer disposed over the reflection layer, having a rugged top surface corresponding to the reflection layer, wherein the reflection layer is completely electrically insulated from other structure by the planarization layer and the interlayer dielectric layer;
   a first electrode disposed over the planarization layer, having a rugged top surface corresponding to the reflection layer;
   a pixel defining layer disposed over the planarization layer, exposing the rugged top surface of the first electrode and defining the luminance region; and
   an electroluminescent layer and a second electrode sequentially stacked over the first electrode.

2. The image display device as claimed in claim 1, further comprising:
   a thin film transistor disposed under the interlayer dielectric layer and in the non-luminance region, having a source/drain region; and
   a conductive layer disposed in the non-luminance region and over the interlayer dielectric layer, wherein a first opening is formed in the interlayer dielectric layer and the conductive layer is coupled to the source/drain region via the first opening.

3. The image display device as claimed in claim 2, wherein the planarization layer is formed with a second opening, and the first electrode is coupled to the conductive layer via the second opening.

4. The image display device as claimed in claim 2, wherein the conductive layer and the reflection layer comprise same material.

5. The image display device as claimed in claim 1, wherein the electroluminescent layer and the second electrode respectively have a rugged top surface corresponding to the reflection layer.

6. The image display device as claimed in claim 1, wherein the first electrode is an anode, the second electrode is a cathode, and the first, second electrodes and the electroluminescent layer form a light emitting element.

7. The image display device as claimed in claim 1, wherein the reflection layer has a planar top surface.

8. A method for fabricating an image display device, comprising:
- forming an interlayer dielectric layer over a substrate, wherein the substrate has a luminance region and a non-luminance region thereover;
- forming a reflection layer over the interlayer dielectric layer in the luminance region;
- forming a planarization layer over the reflection layer;
- forming at the top of the planarization layer a rugged top surface corresponding to the reflection layer, comprising:
  - forming a resist layer with an opening therein over the planarization layer, wherein the opening substantially aligns to the reflection layer and exposes a portion of a top surface of the planarization layer;
  - treating the portion of the top surface of the planarization layer exposed by the opening, using the resist layer as a mask, thereby forming the rugged top surface on top of the substrate; and
  - removing the resist layer;
- forming a first electrode over the planarization layer, having a rugged top surface corresponding to the reflection layer;
- forming a pixel defining layer disposed over the planarization layer, exposing the rugged top surface of the first electrode and defining the luminance region; and
- sequentially stacking an electroluminescent layer and a second electrode over the first electrode.

9. The method as claimed in claim 8, further comprising:
- providing a thin film transistor (TFT) in the non-luminance region, wherein the TFT is formed under the interlayer dielectric layer and has a source/drain region; and
- forming a conductive layer in the non-luminance region and over the interlayer dielectric layer, wherein the interlayer dielectric is formed with a first opening and the conductive layer is coupled to the source/drain region via the first opening.

10. The method as claimed in claim 9, wherein the planarization layer is formed with a second opening, and the first electrode is coupled to the conductive layer via the second opening.

11. The method as claimed in claim 9, wherein the electroluminescent layer and the second electrode respectively have a rugged top surface corresponding to the reflection layer.

12. The method as claimed in claim 8, wherein the conductive layer and the reflection layer comprise same material.

13. The method as claimed in claim 8, wherein the first electrode is an anode, the second electrode is a cathode, and the first, second electrodes and the electroluminescent layer form a light emitting element.

14. The method as claimed in claim 8, wherein the reflection layer has a planar top surface.

15. An image display system, comprising:
- an image display device including a display panel, comprising:
  - a substrate having a luminance region and a none-luminance region thereover;
  - an interlayer dielectric layer disposed over the substrate;
  - a reflection layer disposed over the interlayer dielectric layer in the luminance region, wherein the reflection layer does not extend to electrically connect to any other structure;
  - a planarization layer disposed over the reflection layer, having a rugged top surface corresponding to the reflection layer, wherein the reflection layer is completely electrically insulated from other structure by the planarization layer and the interlayer dielectric layer;
  - a first electrode disposed over the planarization layer, having a rugged top surface corresponding to the reflection layer;
  - a pixel defining layer disposed over the planarization layer, exposing the rugged top surface of the first electrode and defining the luminance region; and
  - an electroluminescent layer and a second electrode sequentially stacked over the first electrode; and
- an input unit coupled to the image display device to control the image display device for rendering an image.

* * * * *